US006570418B2

United States Patent
Uehara

(10) Patent No.: US 6,570,418 B2
(45) Date of Patent: May 27, 2003

(54) TIMING ADJUSTING CIRCUIT

(75) Inventor: Takafumi Uehara, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 10/124,133

(22) Filed: Apr. 17, 2002

(65) Prior Publication Data

US 2002/0149406 A1 Oct. 17, 2002

(30) Foreign Application Priority Data

Apr. 17, 2001 (JP) .......................................... 2001-118071

(51) Int. Cl.[7] ................................................ H03L 7/00
(52) U.S. Cl. ........................................ 327/141; 327/151
(58) Field of Search ................................ 327/141, 142, 327/151, 153, 155, 160, 161, 263, 265, 276, 217, 218

(56) References Cited

U.S. PATENT DOCUMENTS

| | | | | |
|---|---|---|---|---|
| 4,206,485 A | * | 6/1980 | Sakamoto | ................. 360/70 |
| 4,516,861 A | * | 5/1985 | Frew et al. | ................. 368/120 |
| 6,396,321 B1 | * | 5/2002 | Watanabe et al. | ........... 327/158 |

* cited by examiner

*Primary Examiner*—Timothy P. Callahan
*Assistant Examiner*—Linh Nguyen
(74) *Attorney, Agent, or Firm*—Fish & Richardson P.C.

(57) ABSTRACT

A timing adjusting circuit receives a clock and a data from an outside, and outputs the delayed data to the outside. A variable delay circuit receives the data and outputting the data delayed according to a value set by a delay value setting signal A first flip-flop has a data input terminal for inputting the data output from the variable delay circuit and a clock input terminal for receiving an inverse signal of the clock being frequency divided. A second flip-flop has a data input terminal for receiving a fixed value and a clock input terminal for receiving a signal output from the first flip-flop. A counter has a counter enable input terminal for inputting a signal output from the second flip-flop, counts the clock at every plural periods, and sends an output count value as the delay value setting signal to the variable delay circuit.

7 Claims, 3 Drawing Sheets

TIMING ADJUSTING CIRCUIT

BACKGROUND OF THE INVENTION

1. Field of the Invention

The present invention relates to a timing adjusting circuit, and more particularly to that for automatically adjusting a set-up time and a hold time between a data signal and a clock signal that are input into a flip-flop.

2. Description of the Related Art

A flip-flop for use in a typical integrated circuit cannot read correct data unless a set-up time and a hold time involving a time difference between a rising timing of the input-clock signal and a change timing of the input data signal are satisfied.

Therefore, the timing adjustment is required to make by delaying the input data signal. One example of the conventional timing adjusting circuit is shown in FIG. 3 and will be described below.

As shown in FIG. 3, a flip-flop 2 is provided at an input former stage of a logical circuit for making various arithmetical operations in an integrated circuit 4.

Also, a variable delay circuit 31 into which a data signal 21 is input is provided, its output signal being connected to a data input terminal of the flip-flop 2, and a clock signal 22 is input into a clock input terminal of the flip-flop 2.

A set-up timing and a hold timing between the data signal and the clock signal to be input into the flip-flop 2 are adjusted by changing the timing of the data signal 21 in the variable delay circuit 31.

However, the conventional timing adjusting circuit as described above has a problem that it is difficult to make the timing adjustment if the signal rate is fast.

Also, in the case where a great number of input data signals are present, a number of variable delay circuits are required corresponding to the number of input data signals, resulting in a problem that the circuit size of the timing adjusting circuit is increased.

SUMMARY OF THE INVENTION

The present invention has been achieved in the light of the above-mentioned problems. It is an object of the invention to provide the timing adjusting circuit that can automatically adjust the set-up time and the hold time between the data signal and the clock signal to be input into the flip-flop in the integrated circuit even if the corresponding signal rate is fast, in which the circuit size can be reduced.

To accomplish the above object, according to a first aspect of the present invention, there is provided a timing adjusting circuit into which a clock signal and a data signal are input from the outside and from which the data signal delayed is output to the outside, the timing adjusting circuit comprising a variable delay circuit for inputting the data signal and outputting the data signal delayed in accordance with a value set by a delay value setting signal, a first flip-flop having a data input terminal for inputting the data signal output from the variable delay circuit and a clock input terminal for inputting an inverse signal of the clock signal that is frequency divided, a second flip-flop having a data input terminal with a fixed input and a clock input terminal for inputting a signal output from the first flip-flop, and a counter having a counter enable input terminal for inputting a signal output from the second flip-flop, the counter counting the clock signal at every plural periods, and sending an output count value as the delay value setting signal to the variable delay circuit.

Thereby, the variable delay circuit delays the data signal by an amount of count value, and outputs the data signal delayed to the outside, thereby accomplishing the object.

Further, according to a second aspect of the invention, there is provided the timing adjusting circuit, further comprising a first frequency divider for dividing the frequency of the clock signal into half, and an inverter for inverting the clock signal, wherein an inverse signal of the frequency divided clock signal is generated.

Thereby, the inverse signal of the clock signal frequency divided can be easily generated into the clock input terminal of the first flip-flop.

Also, according to a third aspect of the invention, there is provided the timing adjusting circuit, further comprising a second frequency divider for dividing the frequency of the clock signal into 1/N, wherein a output signal of the second frequency divider is input into the clock input terminal of the counter.

Thereby, the counter can count the clock signal at every N periods.

Also, according to a fourth aspect of the invention, there is provided the timing adjusting circuit, wherein a set-up time and a hold time of an external flip-flop are adjusted by passing an output signal of the variable delay circuit into a data input terminal of the external flip-flop.

Thereby, the set-up time and the hold time between the data signal and the clock signal to be input into the external flip-flop in the integrated circuit can be adjusted automatically.

DETAIELD DESCRIPTION OF THE PRESENT INVENTION

The preferred embodiments of the present invention will be described below with reference to the accompanying drawings.

Figure 1:
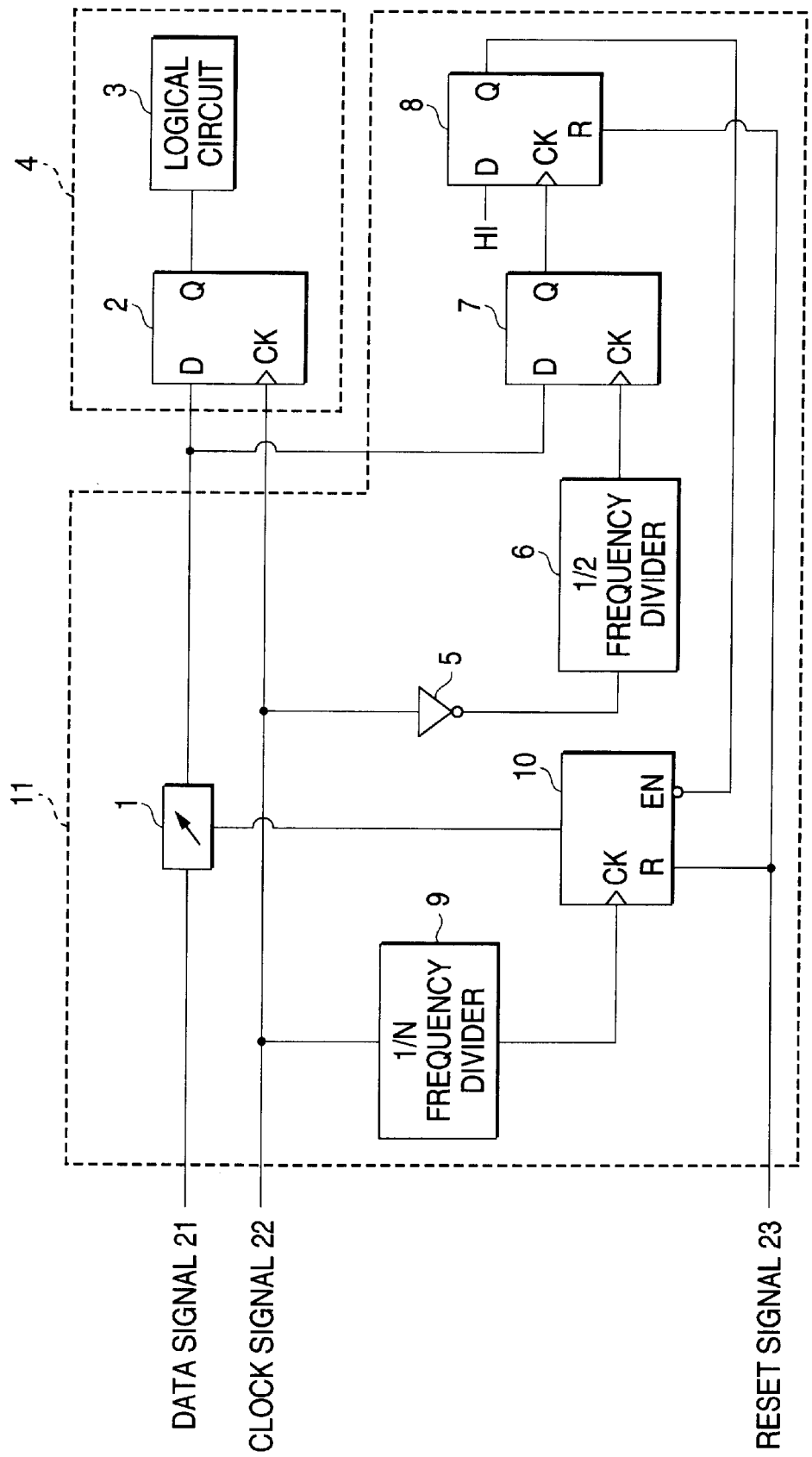
FIG. 1 is a block diagram of the timing adjusting circuit according to one embodiment of the present invention.

FIG. 1 is a block diagram showing a timing adjusting circuit according to an embodiment of the invention.

As shown in FIG. 1, the timing adjusting circuit 11 comprises a variable delay circuit 1, the flip-flops 7 and 8, an inverter 5, frequency dividers 6 and 9, and a counter 10.

The timing adjusting circuit 11 automatically adjusts the set-up time and the hold time for a data signal 21 and a clock signal 22 that are input into a flip-flop 2 provided at the former stage of a logical circuit 3 in an integrated circuit 4, for example.

In FIG. 1, for the elements of the circuit, reference sign D denotes a data input terminal, CK denotes a clock input terminal, Q denotes a data output terminal, R denotes a reset signal input terminal, and EN denotes an enable input terminal.

The detailed configuration of the parts of the timing adjusting circuit 11 will be described below.

The variable delay circuit 1 delays the input data signal 21 in accordance with a set value of a delay value setting signal, and outputs the data to a data input terminal of the external flip-flop 2.

A first flip-flop 7 accepts an output signal of the variable delay circuit 1 as the data input, and has a clock input of the clock signal which is inverted by the inverter 5 and frequency divided into half by the frequency divider 6.

A second flip-flop 8 fixes the data input at a high level (Hi), and has a clock input that is the output signal from the (first) flip-flop 7.

The frequency divider 9 divides a frequency of the clock signal into 1/N (N is an integer) and outputs a frequency divided signal to the clock input of the counter 10.

The counter 10 accepts a count enable signal that is the output signal of the second flip-flop 8, counts up for every plural periods of the clock signal 22 since an output of the frequency divider 9 is input into a clock input terminal, and sends an output count value as a delay value setting signal to the variable delay circuit 1.

Figure 3:
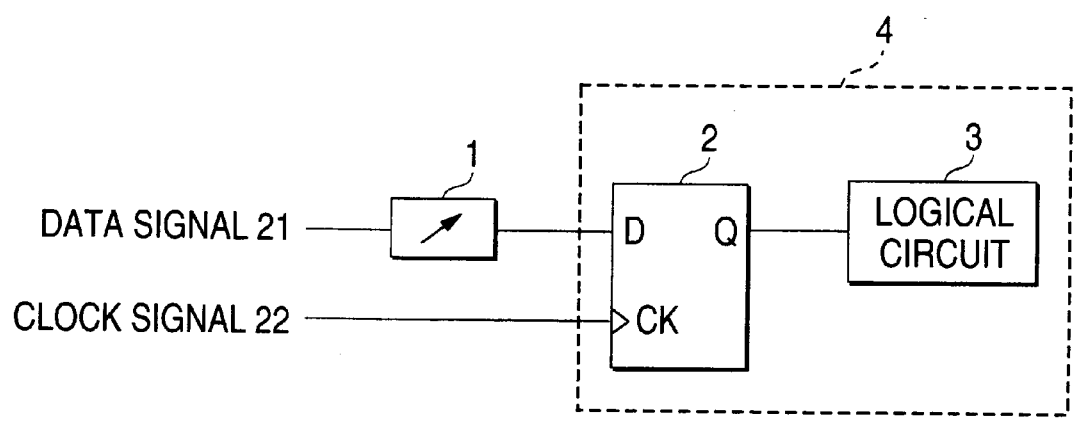
FIG. 3 is a block diagram of the conventional timing adjusting circuit.

The operation timing of the timing adjusting circuit according to this embodiment will be described below with reference to a timing chart of FIG. 3.

Herein, the frequency division ratio of the frequency divider 9 is ¼.

Figure 2:
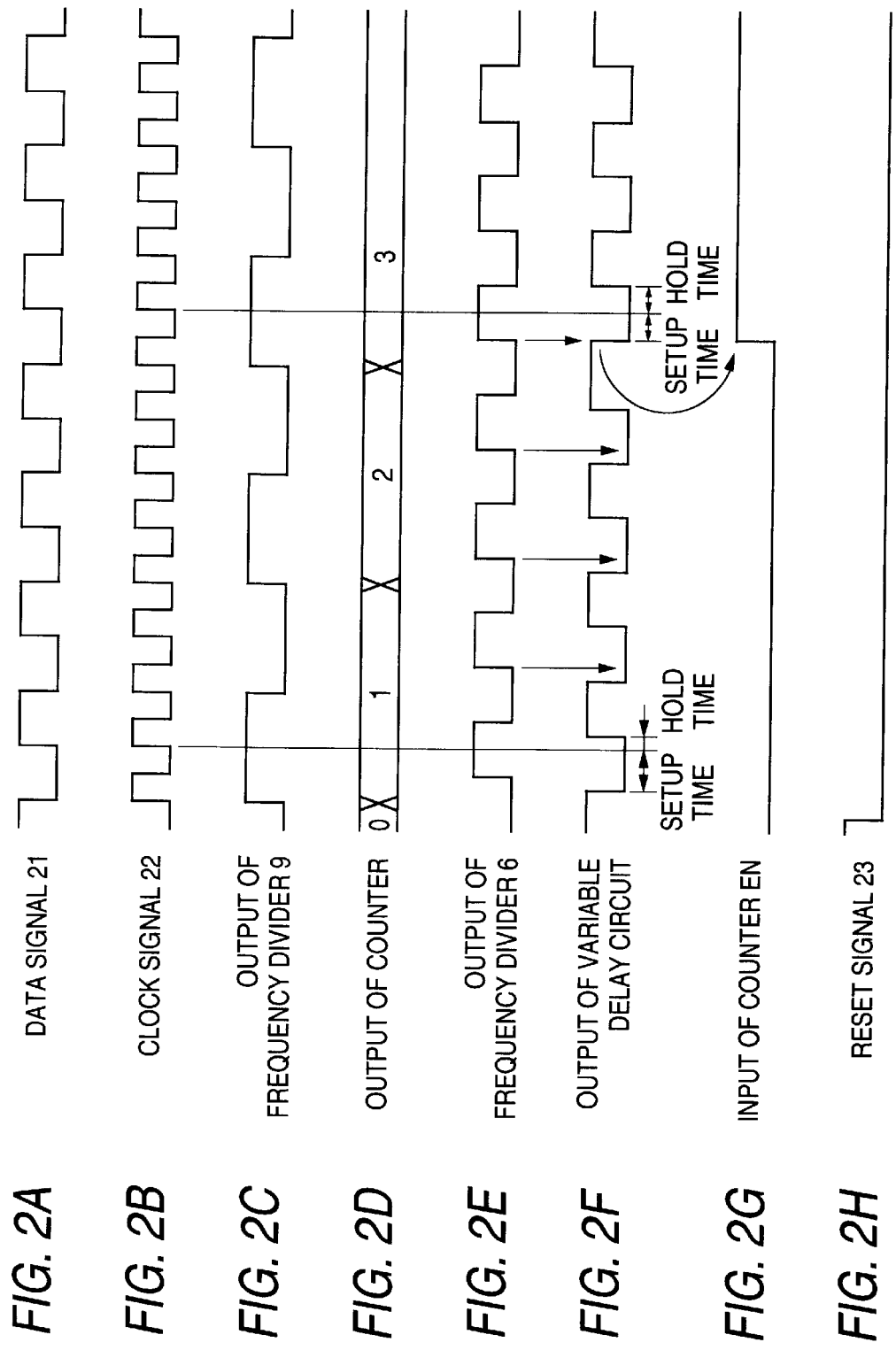
FIGS. 2A to 2H are timing charts for explaining the operation of the timing adjusting circuit according to one embodiment of the invention.

FIG. 2A is a waveform chart of the data signal 21, FIG. 2B is a waveform chart of the clock signal 22, FIG. 2C is a waveform chart of the output of the frequency divider 9, FIG. 2D is a waveform chart of the output (delay value setting signal) of the counter 10, FIG. 2E is a waveform chart of the output of the frequency divider 6, FIG. 2F is a waveform chart of the output of the variable delay circuit 1, FIG. 2G is a waveform chart of an enable input (EN) of the counter 10, and FIG. 2H is a waveform chart of a reset signal 23.

First of all, the counter 10 and the flip-flop 8 are reset to the initial states (all in "low level") by the reset signal 23 of FIG. 2H. The data signal 21 is synchronized with the clock signal 22 of FIG. 2B and consists of a repetitive signal of "high level", "low level", "high level", and "low level" as shown in FIG. 2A.

The clock signal 22 is frequency divided into ¼ by the frequency divider 9 to have an output waveform of the frequency divider 9 as shown in FIG. 2C, which is input as a clock signal into the counter 10. The counter 10 counts up and outputs the count value in the order of "1", "2", "3" in a counter output waveform of FIG. 2D.

Also, the clock signal 22 is inverted by the inverter 5, and frequency divided into ½ by the frequency divider 6 to have an output waveform of the frequency divider 6 as shown in FIG. 2E.

The variable delay circuit 1 delays the data signal 21 by an amount corresponding to the count value "1", "2", "3", and outputs a waveform of the variable delay circuit as shown in FIG. 2F.

The flip-flop 7 takes in the output of the variable delay circuit 1 at a clock of the output of the frequency divider 6. The output of the flip-flop 7 is changed from the "low level" to the "high level", the flip-flop 8 outputs a waveform of FIG. 2G as an enable signal of the counter 10.

The counter 10 stops to count up in accordance with this enable signal, and holds a state of the count value "3". At this time, the set-up time and the hold time between the data signal and the clock signal that are input into the flip-flop 2 are optimal as shown in FIG. 2F.

As described above, with the first aspect of the present invention, it is possible to provide a timing adjusting circuit, comprising a variable delay circuit for inputting the data signal and outputting the data signal delayed in accordance with a value set by a delay value setting signal, a first flip-flop having a data input terminal for inputting the data signal output from the variable delay circuit and a clock input terminal for inputting an inverse signal of the clock signal that is frequency divided, a second flip-flop having a data input terminal with a fixed input and a clock input terminal for inputting a signal output from the first flip-flop, and a counter having a counter enable input terminal for inputting a signal output from the second flip-flop, the counter counting the clock signal at every plural periods, and sending an output count value as the delay value setting signal to the variable delay circuit. Thereby the variable delay circuit can delay the data signal by an amount of count value, and output the data signal delayed to the outside.

Further, with the second aspect of the invention, it is possible to provide the timing adjusting circuit, further comprising a first frequency divider for dividing the frequency of the clock signal into half, and an inverter for inverting the clock signal, whereby an inverse signal of the frequency divided clock signal is easily generated.

Also, with the third aspect of the invention, it is possible to provide the timing adjusting circuit, further comprising a second frequency divider for dividing the frequency of the clock signal into 1/N, wherein a output signal of the second frequency divider is input into the clock input terminal of the counter. Thereby, the counter can count the clock signal at every N periods.

Also, with the fourth aspect of the invention, it is possible to provide the timing adjusting circuit, wherein a set-up time and a hold time of an external flip-flop are automatically adjusted by passing an output signal of the variable delay circuit into a data input terminal of the external flip-flop.

In this manner, the timing adjusting circuit of the invention can automatically adjust the set-up time and the hold time between the data signal and the clock signal to be input into the flip-flop in the integrated circuit, even if the corresponding signal rate is fast, in which the circuit size can be reduced.

Further, because of the reduced circuit size, the timing adjusting circuit can be contained in the integrated circuit comprising the flip-flop and the logical circuit.

What is claimed is:

1. A timing adjusting circuit which receives a clock signal and a data signal from an outside and outputs the data signal delayed is output to the outside, the timing adjusting circuit comprising:

a variable delay circuit for receiving the data signal and outputting the data signal delayed in accordance with a value set by a delay value setting signal;

a first flip-flop having a data input terminal for receiving the data signal output from the variable delay circuit and a clock input terminal for receiving an inverse signal of the clock signal being frequency divided;

a second flip-flop having a data input terminal receiving a fixed value and a clock input terminal for inputting a signal output from the first flip-flop; and a counter having a counter enable input terminal for receiving a signal output from the second flip-flop, the counter counting the clock signal at every plural periods, the counter sending an output count value as the delay value setting signal to the variable delay circuit.

2. The timing adjusting circuit according to claim 1, further comprising a first frequency divider for dividing the frequency of the clock signal into half; and an inverter for inverting the clock signal, wherein the first frequency divider and the inverter generates an inverse signal of the frequency divided clock signal.

3. The timing adjusting circuit according to claim 1, further comprising a second frequency divider for dividing the frequency of the clock signal into 1/N, the second frequency divider outputting an output signal to the clock input terminal of the counter.

4. The timing adjusting circuit according to claim 2, further comprising a second frequency divider for dividing the frequency of the clock signal into 1/N, the second frequency divider outputting an output signal to the clock input terminal of the counter.

5. The timing adjusting circuit according to claim 1, wherein the variable delay circuit outputs an output signal to a data input terminal of an external flip-flop, thereby to adjust a set-up time and a hold time of the external flip-flop.

6. The timing adjusting circuit according to claim 2, wherein the variable delay circuit outputs an output signal to a data input terminal of an external flip-flop, thereby to adjust a set-up time and a hold time of the external flip-flop.

7. The timing adjusting circuit according to claim 3, wherein the variable delay circuit outputs an output signal to a data input terminal of an external flip-flop, thereby to adjust a set-up time and a hold time of the external flip-flop.

* * * * *